United States Patent
Kim et al.

(10) Patent No.: US 9,252,136 B2
(45) Date of Patent: Feb. 2, 2016

(54) PACKAGE STACKED DEVICE

(71) Applicant: SK hynix Inc., Icheon-si Gyeonggi-do (KR)

(72) Inventors: Seung Jee Kim, Seongnam-si (KR); Qwan Ho Chung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 14/468,885

(22) Filed: Aug. 26, 2014

(65) Prior Publication Data
US 2015/0287702 A1  Oct. 8, 2015

(30) Foreign Application Priority Data

Apr. 7, 2014  (KR) .................. 10-2014-0041272

(51) Int. Cl.
*H01L 23/02* (2006.01)
*H01L 25/11* (2006.01)
*H01L 23/498* (2006.01)

(52) U.S. Cl.
CPC ........ *H01L 25/117* (2013.01); *H01L 23/49811* (2013.01); *H01L 23/49827* (2013.01); *H01L 23/49838* (2013.01); *H01L 2224/18* (2013.01)

(58) Field of Classification Search
USPC .......... 257/686, 723, 726, E25.031–E25.032, 257/E23.042, 772, 779, E23.015, E23.02, 257/E23.023–E23.079; 438/6, 28, 66, 67, 438/107, 109, 406, 455–459
See application file for complete search history.

(56) References Cited

U.S. PATENT DOCUMENTS

| 6,881,609 B2 | 4/2005 | Salmon |
| 6,927,471 B2 | 8/2005 | Salmon |
| 7,262,082 B1 * | 8/2007 | Lin ..................... H01L 21/6835 257/698 |
| 2012/0020026 A1 * | 1/2012 | Oganesian ............ H01L 25/117 361/707 |
| 2012/0133052 A1 * | 5/2012 | Kikuchi ............ H01L 23/49827 257/774 |

FOREIGN PATENT DOCUMENTS

KR  1020110021123 A  3/2011

* cited by examiner

*Primary Examiner* — Dao H Nguyen
*Assistant Examiner* — Tram H Nguyen
(74) *Attorney, Agent, or Firm* — William Park & Associates Ltd.

(57) ABSTRACT

A package stacked device may include a first packaging body layer having a first chip embedded therein, and a second packaging body layer positioned under the first packaging body layer and having a second chip embedded therein. The package stacked device may also include a first connection unit protruding from a first bottom surface of the first packaging body layer, a second connection unit protruding from a second top surface of the second packaging body layer, a first covering layer providing a first opening to expose the top surface of the second connection unit and substantially covering the second top surface of the second packaging body layer, and a first adhesive layer substantially covering the exposed top surface of the second connection unit within the first opening. The first connection unit may be inserted into the first opening and connected to the first adhesive layer.

20 Claims, 8 Drawing Sheets

[START_REF]US 9,252,136 B2[END_REF]

PACKAGE STACKED DEVICE

CROSS-REFERENCES TO RELATED APPLICATIONS

The present application claims priority under 35 U.S.C 119(a) to Korean Patent Application No. 10-2014-0041272, filed on Apr. 7, 2014, in the Korean intellectual property Office, and which is incorporated herein by reference in its entirety.

BACKGROUND

1. Technical Field

Various embodiments generally relate to a package stacking technology, and more particularly, to a package stacked device possessing a small thickness.

2. Related Art

Semiconductor devices used with electronic appliances may include various electronic circuit elements. These electronic circuit elements may be integrated in a semiconductor substrate called a semiconductor chip or die. The semiconductor devices may be packaged in a form of a memory semiconductor chip package, and may be employed in an electronic appliance such as, for example but not limited to, a computer, a mobile device, or data storage, etc.

Recently, with the reduction in weight and size of electronic products such as, for example, smart phones, semiconductor device packages are required to have a relatively small thickness and size. Furthermore, various attempts have been made to form a one package product by stacking single package products, thereby implementing a high-capacity or multi-functional device. For example, package on package (POP) technology has been developed. According to the POP technology, two or more single packages may be stacked and then interconnected to each other through a solder ball.

SUMMARY

In an embodiment, a package stacked device may include a first packaging body layer having a first chip embedded therein, and a second packaging body layer positioned under the first packaging body layer and having a second chip embedded therein. The package stacked device may also include a first connection unit protruding from a first bottom surface of the first packaging body layer, and a second connection unit protruding from a second top surface of the second packaging body layer. package stacked device may include a first covering layer providing a first opening to expose the top surface of the second connection unit and substantially covering the second top surface of the second packaging body layer, and a first adhesive layer substantially covering the exposed top surface of the second connection unit within the first opening. The first connection unit may be inserted into the first opening and connected to the first adhesive layer.

\* claim 부에서 삭제되어 제출되는 시스템 클레임 등의 내용을 summary 에 잔존시킵니다. In and embodiment, a memory card includes a package stacked device, the package stacked device may include: a first packaging body layer having a first chip embedded therein, and a second packaging body layer positioned under the first packaging body layer and having a second chip embedded therein. The package stacked device may also include a first connection unit protruding from a first bottom surface of the first packaging body layer, and a second connection unit protruding from a second top surface of the second packaging body layer. package stacked device may include a first covering layer providing a first opening to expose the top surface of the second connection unit and substantially covering the second top surface of the second packaging body layer, and a first adhesive layer substantially covering the exposed top surface of the second connection unit within the first opening. The first connection unit may be inserted into the first opening and connected to the first adhesive layer.

In an embodiment, an electronic system may include a package stacked device, the package stacked device may include: a first packaging body layer having a first chip embedded therein, and a second packaging body layer positioned under the first packaging body layer and having a second chip embedded therein. The package stacked device may also include a first connection unit protruding from a first bottom surface of the first packaging body layer, and a second connection unit protruding from a second top surface of the second packaging body layer. package stacked device may include a first covering layer providing a first opening to expose the top surface of the second connection unit and substantially covering the second top surface of the second packaging body layer, and a first adhesive layer substantially covering the exposed top surface of the second connection unit within the first opening. The first connection unit may be inserted into the first opening and connected to the first adhesive layer.

In an embodiment, a package stacked device may include a first packaging body layer and a second packaging body layer positioned adjacent the first packaging body layer. The package stacked device may also include a first connection unit protruding from a first bottom surface of the first packaging body layer, a second connection unit protruding from a second top surface of the second packaging body layer, and a first covering layer providing a first opening to expose the top surface of the second connection unit and substantially covering the second top surface of the second packaging body layer. The package stacked device may include a first adhesive layer substantially covering the exposed top surface of the second connection unit, and the top surface of the first connection unit is within the first opening.

DETAILED DESCRIPTION

Various embodiments will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

In the present specification, terms such as "first" and "second" are used to distinguish members from each other, and do not limit the members or indicate a specific order. Furthermore, when a member is referred to as being "on" another member or being at the "top" or "bottom" of or "inside" another member, it indicates the relative positional relation therebetween, and does not specify the case in which the member is directly contacted with the another member or another member is further interposed at the interface therebetween. Furthermore, when an element is referred to as being "coupled" or "connected" to another element, it indicates that the element is directly coupled or connected to the another element, and an additional layer may be interposed therebetween. When two elements are "directly coupled" or "directly connected" to each other, it may indicate that no element is interposed therebetween. Such an indication may also be applied to other expressions for describing the relation between elements. A semiconductor chip may indicate a chip obtained by dicing a semiconductor substrate having electronic circuits integrated therein in the form of a chip. A semiconductor substrate or semiconductor chip may indicate a memory chip such as DRAM, SRAM, FLASH, MRAM, ReRAM, FeRAM, or PcRAM or a logic chip having a logic circuit integrated therein.

FIGS. 1 to 6 are diagrams for explaining the structure of a package stacked device in accordance with an embodiment.

Figure 1:
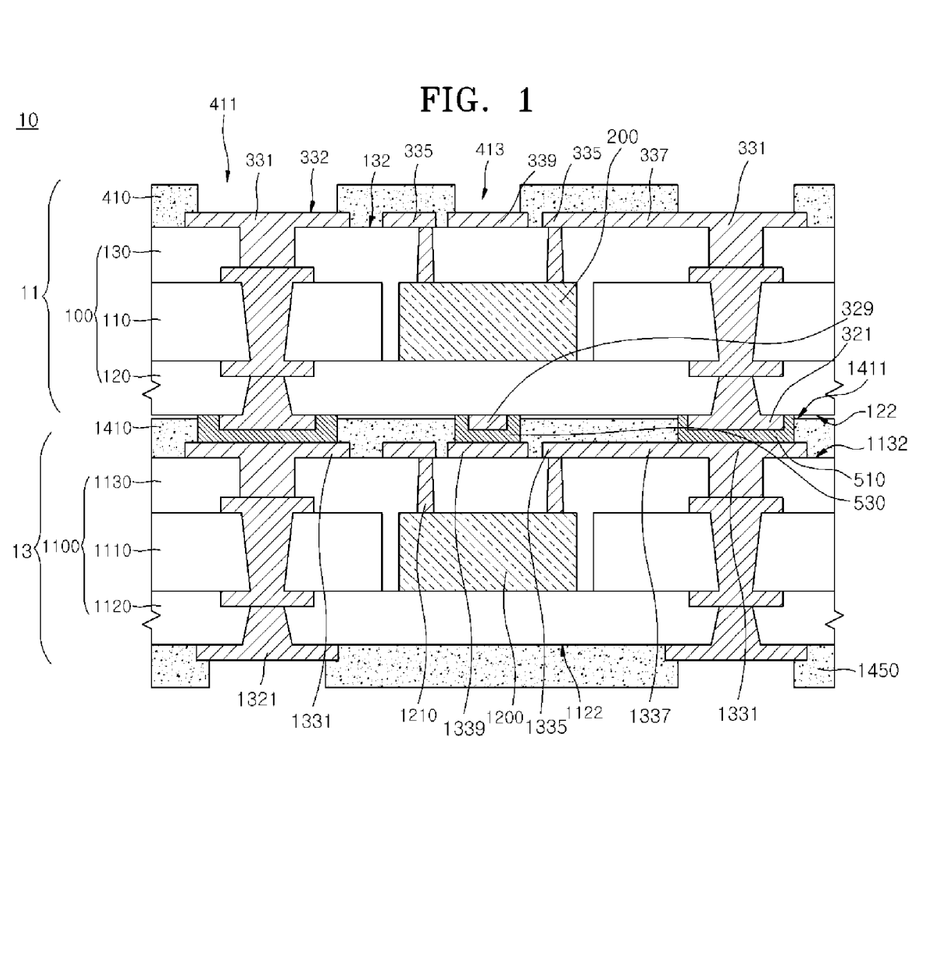
FIG. 1 is a cross-sectional view representation of a package stacked device in accordance with an embodiment.

Referring to FIG. 1, the package stacked device 10 may have a structure in which two or more single packages 11 and 13 are stacked. Each of the single packages 11 and 13 may be provided in the form of a chip embedding package which includes a packaging body layer 100 or 1100 having a semiconductor chip 200 or 1200 embedded therein. The packaging body layer 100 or 1100 may be formed of a dielectric material which protects the semiconductor chip 200 or 1200 embedded therein and electrically insulates the semiconductor chip 200 or 1200, and provided in the form of a substrate having a chip embedded therein. The packaging body layer 100 or 1100 may include a plurality of dielectric layers 110, 120, and 130 or 1110, 1120, and 1130 laminated therein. Furthermore, the packaging body layer 100 or 1100 may include circuit patterns 331, 335, and 337 or 321 or 1331, 1335, and 1337 or 1321 formed on the top surface 132 or 1132 or the bottom surface 122 or 1122 thereof. The circuit patterns 331, 335, and 337 or 321 or 1331, 1335, and 1337 or 1321 may be paths of electrical signals to the semiconductor chip 200 or 1200 embedded in the packaging body layer 100 or 1100 or provide a path of power to the semiconductor chip 200 or 1200. The semiconductor chip 200 or 1200 may include an active element such as a memory chip or logic chip.

The package stacked device 10 may have a structure in which the first package 11 is stacked over the second package 13. When the first connection unit 321 of the first package 11 and a second connection unit 1331 of the second package 13 are connected through a first adhesive layer 510, the first package 11 and the second package 13 may be connected to each other. Since the first and second connection units 321 and 1331 formed as a part of the circuit patterns are directly connected to each other through the first adhesive layer 510, the height of the interconnection structure may correspond to the sum of the thicknesses of the first and second connection units 321 and 1331 and the first adhesive layer 510 interposed therebetween. In these cases, since a separate interconnection member such as a solder ball does not need to be used between the packages 11 and 13, the entire thickness of the interconnection structure may be reduced by the height of the interconnection member. Thus, since the entire thickness of the package stacked device 10 may be reduced to a lower level depending on the decrease of the height of the interconnection member, it may be possible to implement a package stacked device having a smaller thickness. However, when the interconnection structure employs, for example, a solder ball, a space with a predetermined size or more must be reserved for or secured for the use of the solder ball. Having to reserve a space that will accommodate, for example, the solder ball makes it difficult to reduce the height of the interconnection structure and subsequently the total height of a package stacked device. Furthermore, when the solder ball uses a smaller size than a predetermined size, for example, the surface area of each connection unit, the contact area between the solder ball and the connection unit may be reduced. Reducing the contact area between the solder ball and the connection unit may degrade the reliability of the package stacked device and/or, for example, the connection between connection units (i.e., first connection unit 321 and second connection unit 1331). Thus, to overcome problems and reliability issues, for example problems associated with the use of a solder ball, a first adhesive layer 510 may be used to couple the first connection unit 321 of the first package 11 to the second connection unit 1331 of the second package 12.

Figure 2:
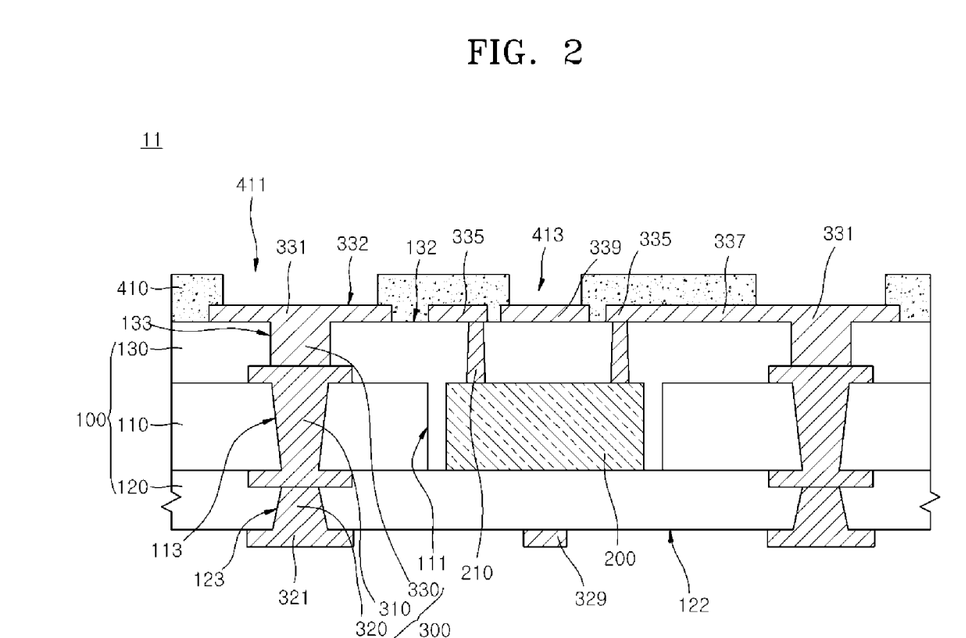
FIGS. 2 to 4 are cross-sectional views of a representation of a single package in accordance with an embodiment.

Referring to FIGS. 1 and 2, the first package 11 may be provided in the form of a chip embedding substrate. The first package 11 may include the first packaging body layer 100 having the first semiconductor chip 200 embedded therein. The first packaging body layer 100 may include a stacked structure of a first top dielectric layer 130 providing the first top surface 132, a first bottom dielectric layer 120 providing the first bottom surface 122, and a first middle dielectric layer 110 interposed therebetween. Although not illustrated, another dielectric layer, other dielectric layers, or conductive layers forming circuit patterns for internal wiring may be provided between the respective dielectric layers 110, 120, and 130.

Figure 3:
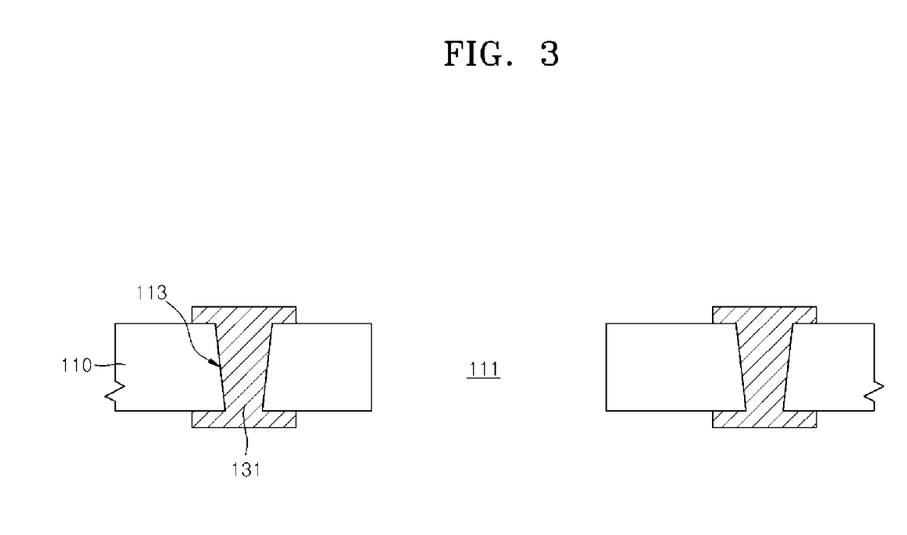
Figure 4:
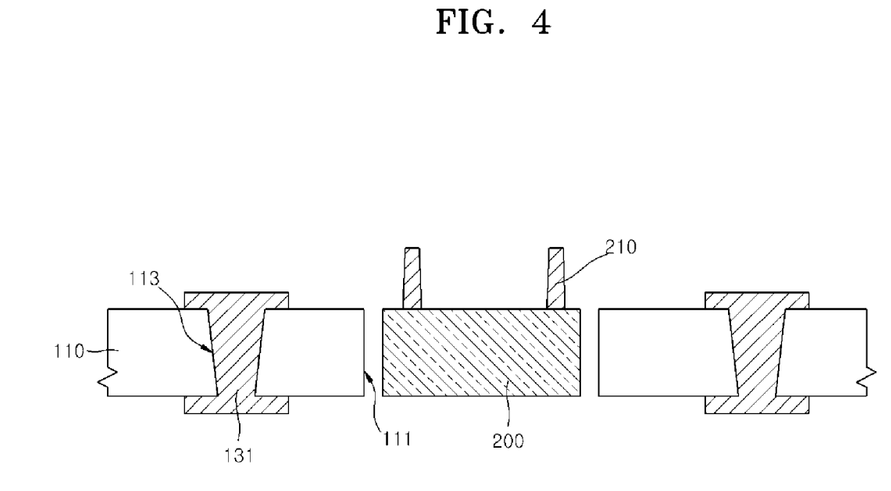

Referring to FIGS. 2, 3, and 4, the first middle dielectric layer 110 may be employed as the core of the first packaging body layer 100, and may include a cavity 111. The first semiconductor chip 200 may be seated in the cavity 111. The cavity 111 may be provided in the form of, for example, a through-hole or concave groove, etc. The first top dielectric layer 130 may be laminated to cover the first semiconductor chip 200 seated in the cavity 111 and to fill the cavity 111. The side of the first semiconductor chip 200 may be surrounded by the first middle dielectric layer 110. The top of the first semiconductor chip 200 may be covered by the first top dielectric layer 130. The bottom of the first semiconductor chip 200 may be covered by the first bottom dielectric layer 120. The first semiconductor chip 200 as a whole may be embedded in the first packaging body layer 100.

Referring to FIG. 2, the first connection unit 321 is provided on the first bottom surface 122 of the first bottom dielectric layer 120 so as to protrude downward. The first connection unit 321 may include a conductive layer pattern forming a part of the first bottom circuit patterns 321 and 329 provided on the first bottom surface 122, for example, a copper (Cu) pattern, etc. The first bottom circuit patterns 321 and 329 may be provided as conductive patterns forming a wiring circuit. In order to electrically couple the first connection unit 321 to the first semiconductor chip 200 embedded in the first packaging body layer 100, an interconnection wiring structure may be provided. For example, a first through via 300 coupled to the first connection unit 321 of the first bottom circuit patterns 321 and 329 may be formed through the first packaging body layer 100. The first through via 300 may include a stacked structure of a first top through via 330 passing through the first top dielectric layer 130, a first bottom through via 320 passing through the first bottom dielectric layer 120, and a first middle through via 310 passing through the first middle dielectric layer 110.

Referring to FIGS. 2 and 3, before the cavity 111 is formed in the first middle dielectric layer 110 through, for example, a drilling process using ultraviolet (UV) laser, a first middle through-hole 113 may be formed in the first middle dielectric layer 110 through a laser drilling process. A conductive layer for filling the first middle through via 113 may be formed through a plating process and then etched to form the first middle through via 310. The first bottom through via 320 may be integrally formed with the first connection unit 321. The first top through via 330 may be formed to be coupled to a part of the first top circuit patterns 331, 335, 337, and 339 provided on the first top surface 132 of the first top dielectric layer 130.

Referring to FIG. 2, the first top circuit patterns 331, 335, 337, and 339 may be provided as a conductive pattern formed of, for example, Cu on the first top surface 132. The first top circuit patterns may include a fourth connection unit 331 coupled to the first top through via 330 or integrally formed with the first top through via 330. The first top circuit patterns may include a first coupling unit 337 extended from the fourth connection unit 331. The first top circuit patterns may include a second coupling unit 335 coupled to a third through via 210 connected to the first semiconductor chip 200. The third through via 210 which electrically couples the first semiconductor chip 200 to the first top circuit pattern has a coupling structure to pass through the first top dielectric layer 130 covering the first semiconductor chip 200. Referring to FIGS. 1 and 4, the third through via 210 may be formed by the following process: the third through via 210 is first provided in the shape of a bump on the surface of the first semiconductor chip 200 seated in the cavity 111 of the first middle dielectric layer 110, and the first top dielectric layer 130 is laminated on the first middle dielectric layer 110 such that the third through via 210 penetrates the first top dielectric layer 130.

The first top dielectric layer 130 and the first bottom dielectric layer 120 may be laminated on the first middle dielectric layer 110 so as to form the first packaging body layer 100, the first top through-hole 133 and the first bottom through-hole 123 may be formed through the first top dielectric layer 130 and the first bottom dielectric layer 120, respectively, and conductive layers for filling the through-holes may be formed on the first top and bottom surfaces 132 and 122, respectively, through a plating process and patterned through a selective etch process. Then, the first top through via 330, the first bottom through via 320, the first top circuit patterns 331, 335, 337, and 339, and the first bottom circuit patterns 321 and 329 may be implemented.

Referring to FIG. 2, a first interconnection reinforcement unit 329 which is electrically isolated from the first connection unit 321 may be provided as a part of the first bottom circuit patterns 321 and 329 on the first bottom surface 122. The first interconnection reinforcement unit 329 may be provided as, for example, an independent pattern or dummy pattern which is electrically isolated from the first semiconductor chip 200 or the first connection unit 321. Referring to FIGS. 1 and 2, as the first interconnection reinforcement unit 329 is connected to a second interconnection reinforcement unit 1339 provided on the second top surface 1132 of the second packaging body layer 1100 of the second package 13 through a second adhesive layer 530, an additional interconnection structure is provided to reinforce the interconnection state between the first and second packages 11 and 13. The additional interconnection structure of the first interconnection reinforcement unit 329, the second interconnection reinforcement unit 1339, and the second adhesive layer 530 does not provide an electrical coupling structure, but provides only a mechanical interconnection structure.

Figure 5:
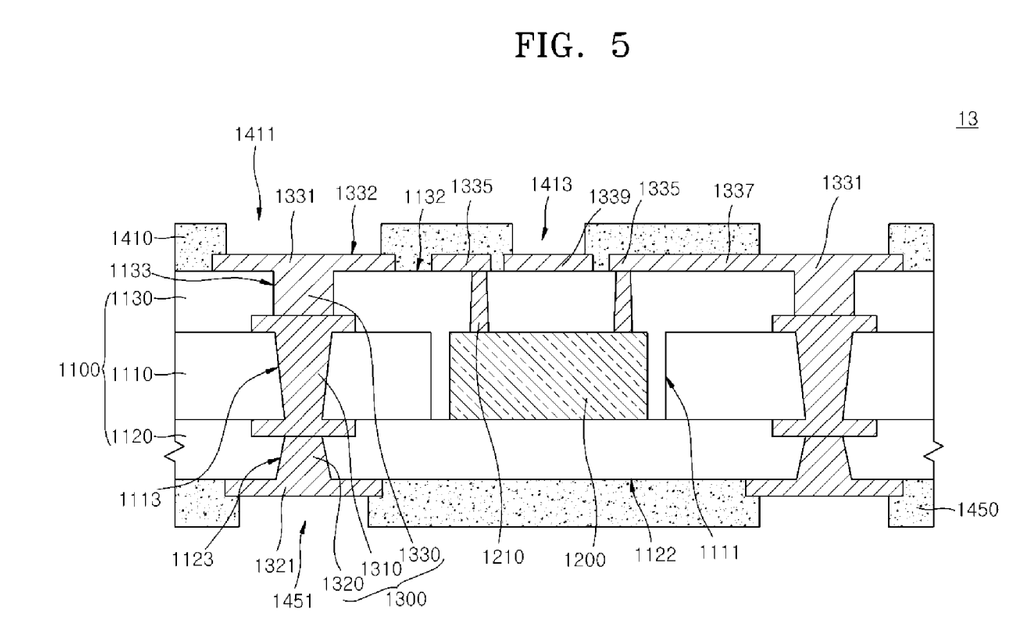
FIG. 5 is a cross-sectional view of a representation of a single package in accordance with an embodiment.

Referring to FIGS. 1, 2, and 5, the second package 13 may be provided in the form of a chip embedding substrate. The second package 13 may include the second packaging body layer 1100 having the second semiconductor chip 1200 embedded therein. The second packaging body layer 1100 may include a stacked structure of the second top dielectric layer 1130 providing the second top surface 1132. The second packaging body layer 1100 may include the second bottom dielectric layer 1120 providing the second bottom 1122. The second packaging body layer 1100 may also include the second middle dielectric layer 1110 interposed therebetween. Although not illustrated, another dielectric layer, other dielectric layers, or conductive layers forming a circuit pattern for internal wiring may be provided between the respective dielectric layers 1110, 1120, and 1130. The second middle dielectric layer 1110 may be employed as the core of the second packaging body layer 1100, and may include a cavity 1111 in which the second semiconductor chip 1200 is seated and which may be provided, for example, in the form of a through-hole or concave groove, etc. The second top dielectric layer 1130 may be laminated to cover the second semiconductor chip 1200 seated in the cavity 1111 and to fill the cavity 1111.

The second connection unit 1331 is provided on the second top surface 1132 of the second top dielectric layer 1130 so as to protrude upward. The second connection unit 1331 may include a conductive layer pattern forming a part of the second top circuit patterns 1331, 1335, 1337, and 1339 provided on the second top surface 1132, for example, a copper pattern, etc. The second top circuit patterns may include a third coupling unit 1337 and a fourth coupling unit 1335. The third coupling unit 1337 is extended from the second connection unit 1331 so as to electrically couple the second connection unit 1331 and the second semiconductor chip 1200, and the fourth coupling unit 1335 is coupled to the fourth through via 1210 connected to the second semiconductor chip 1200. The fourth through via 1210 which electrically couples the second semiconductor chip 1200 to the second top circuit pattern may have a coupling structure that passes through the second top dielectric layer 1130. The second top dielectric layer 1130 covering the second semiconductor chip 1200. The fourth through via 1210 may be formed in the form of a bump.

The second bottom circuit patterns may be provided on the second bottom surface 1122 of the second bottom dielectric layer 1120. A part of the second bottom circuit patterns may be set to a third connection unit 1321 which electrically couples the package stacked device 10 (see FIG. 1) to another external substrate or electronic product. The third connection unit 1321 may be attached to a connection terminal such as a solder ball (not illustrated). Furthermore, a second through via 1300 may be formed through the second packaging body layer 1100. The second through via 1300 may couple the second connection unit 1331 of the second top circuit patterns to the third connection unit 1321 of the second bottom circuit patterns, in order to electrically couple the second top circuit patterns to the second bottom circuit pattern (i.e., 1321). The second through via 1300 may include a stacked structure of a second top through via 1330, a second bottom through via 1320, and a second middle through via 1310. The second top through via 1330 is positioned in a second top through-hole 1133 passing through the second top dielectric layer 1130. The second bottom through via 1320 is positioned in a second bottom through-hole 1123 passing through the second bottom dielectric layer 1120. The second middle through via 1310 fills a second middle through-hole 1113 passing through the second middle dielectric layer 1110. The second bottom through via 1320 may be integrally formed with the third connection unit 1321. The second top through via 1330 may be formed to be coupled to a part of the second top circuit patterns 1331, 1335, 1337, and 1339 provided on the second top surface 1132 of the second top dielectric layer 1130. The second connection unit 1331 may be coupled to the second top through via 1330 or integrally formed with the second top through via 1330. The second top circuit pattern 1331, 1335, 1337, and 1339 may be provided as a conductive layer pattern formed of, for example, copper on the second top surface 1132.

Referring to FIG. 5, a second interconnection reinforcement unit 1339 which is electrically isolated from the second connection unit 1331 is provided on the second top surface 1132 as a part of the second top circuit patterns 1331, 1335, 1337, and 1339. The second interconnection reinforcement unit 1339 may be provided as, for example, an independent pattern or dummy pattern which may be electrically isolated from the second semiconductor chip 1200 or the second connection unit 1331. Referring to FIGS. 1 and 5, as the second interconnection reinforcement unit 1339 is connected to the first interconnection reinforcement unit 329 provided on the first bottom surface 122 of the first packaging body layer 100 of the first package 11 through the second adhesive layer 530, an additional interconnection structure is provided to reinforce the interconnection state of the first and second packages 11 and 13. The additional interconnection structure of the first and second interconnection reinforcement units 329 and 1339 through the second adhesive layer 530 does not provide an electrical coupling structure, but provides only a mechanical coupling structure.

Figure 6:
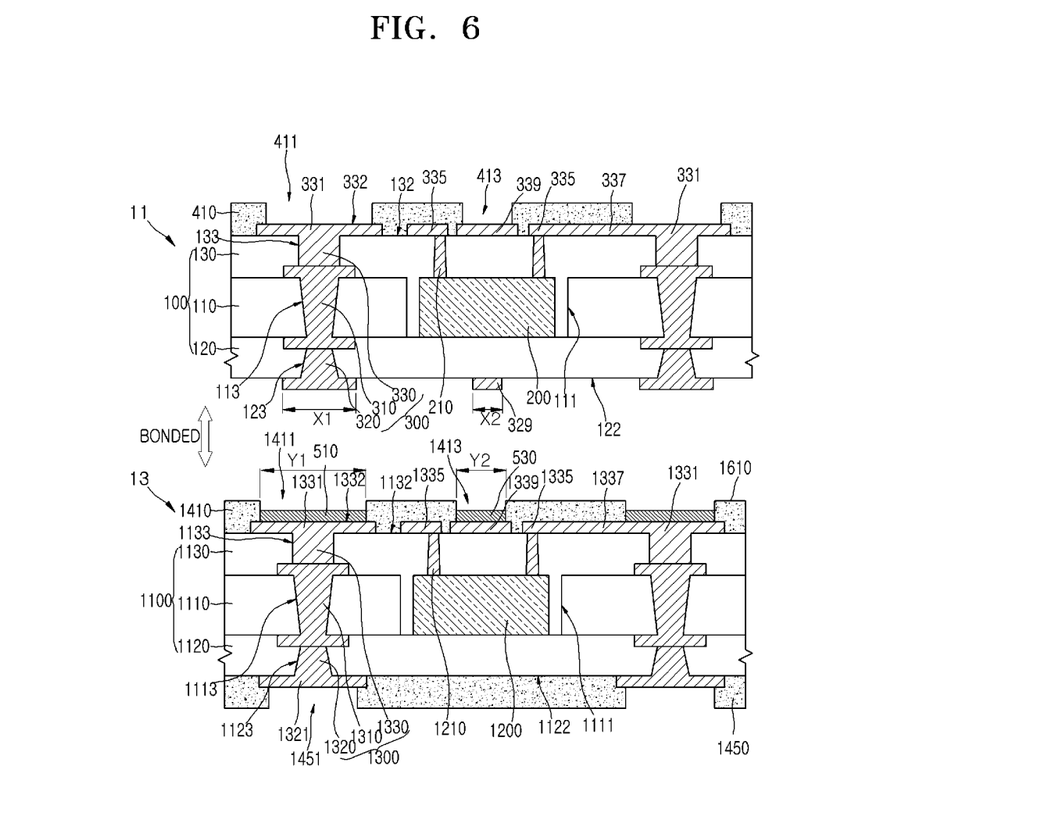
FIG. 6 is a cross-sectional view representation illustrating the process in which single packages having different structures are stacked.

Referring to FIGS. 1 and 6, the second package 13 includes a first covering layer 1410 which provides a first opening 1411 to partially expose the top surface 1332 of the second connection unit 1331 and a second opening 1413 to expose the second interconnection reinforcement unit 1339. The first adhesive layer 510 may be applied to cover the top surface 1332 of the second connection unit 1331 within the first opening 1411 of the first covering layer 1410. The second adhesive layer 530 may be applied to cover the top surface of the second interconnection reinforcement unit 1339 within the second opening 1413 of the first covering layer 1410. The first covering layer 1410 may be formed of, for example, a dielectric material layer, etc. When the first adhesive layer 510 connects the first and second connection units 321 and 1331 and the second adhesive layer 530 connects the first and second interconnection reinforcement units 329 and 1339, the first covering layer 1410 may prevent a conductive adhesive material from overflowing and in preventing the conductive adhesive material from overflowing the first and second adhesive layers 510 and 530 may be formed. The conductive adhesive material may include, for example, solder paste, etc. The first covering layer 1410 may be formed of, for example, a solder resist material layer, etc.

The first package 11 is attached to the second package 13 such that the first connection unit 321 of the first package 11 is inserted into the first opening 1411 so as to be connected to the first adhesive layer 510 applied in the first opening 1411. The first package is attached to the second package 13 such that the first interconnection reinforcement unit 329 is inserted into the second opening 1413 so as to be connected to the second adhesive layer 530 applied in the second opening 1413. Thus, the first connection unit 321 has a width X1, the width X1 having a smaller width than the width Y1 of the first opening 1411. Additionally, the first interconnection reinforcement unit 329 has a width X2, the width X2 having a smaller width than the width Y2 of the second opening 1413.

Referring to FIGS. 1 and 6, the interconnection between the first and second packages 11 and 13 is accomplished through the first adhesive layer 510 between the first and second connection units 321 and 1331, and reinforced through the second adhesive layer 530 between the first and second interconnection reinforcement units 329 and 1339. Thus, the top surface 1610 of the first covering layer 1410 may not be connected to the bottom surface 122 of the first packaging body layer 100, but simply contacted with the bottom surface 122 of the first packaging body layer 100 or separated from the bottom surface 122 of the first packaging body layer 100 with a predetermined gap provided therebetween. In an embodiment, only the second package 13 includes the first covering layer 1410 to cover the second top surface 1132 of the second packaging body layer 1100. However, the first covering layer 1410 may be attached to cover the first bottom surface 122 of the first package 11. That is, the first covering layer 1410 is formed only on any one surface of the second top surface 1132 of the second package 13 and the first bottom surface 122 of the first package 11, and not formed on the other surface facing the one surface. For instance, if the first covering layer 1410 is formed on the second top surface 1132 of the second package 13, the first bottom surface 122 of the first package 11 is not covered by the first covering layer 1410. Thus, the entire thickness of the package stacked device 10 may be reduced.

Referring to FIGS. 1, 5, and 6, a second covering layer 1450 may be further formed to cover the second bottom surface 1122 of the second package 13. The second covering layer 1450 may be further formed to provide a third opening 1451 which exposes the third connection unit 1321. The second covering layer 1450 may be formed of a solder resist material or dielectric material, like the first covering layer 1410. Referring to FIG. 6, the first package 11 may be stacked over the second package 13 so as to implement the package stacked device 10 (see FIG. 1) having two single packages 11 and 13 stacked therein. However, another package or a plurality of packages may be further stacked over the first package 11.

Figure 7:
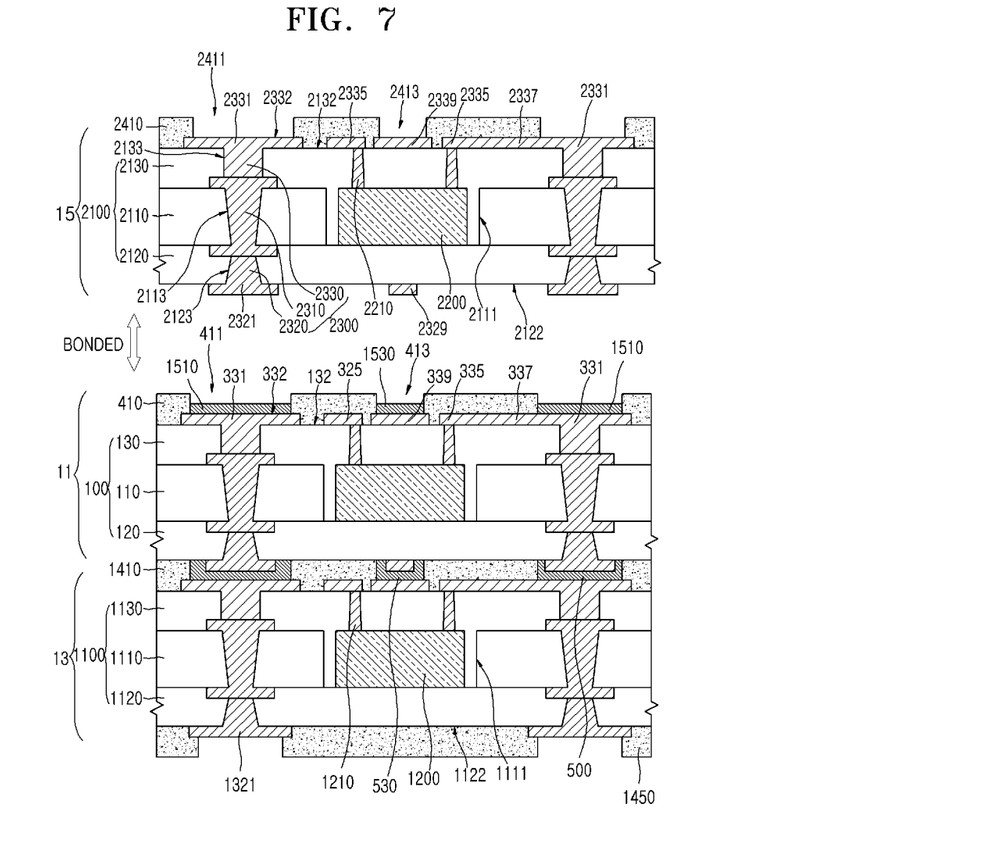
FIG. 7 is a cross-sectional view of a representation of a package stacked device in accordance with an embodiment.

FIG. 7 is a cross-sectional view of a representation of a package stacked device in accordance with an embodiment.

Referring to FIGS. 7 and 1, a third package 15 may be further stacked over the first package 11. The first package 11 may further include a third covering layer 410 which provides a fourth opening 411 to expose a part of the first top circuit patterns 331, 335, 337, and 339 as the fourth connection unit 331 and a fifth opening 413 to expose another part of the first top circuit patterns 331, 335, 337, and 339 as the third interconnection reinforcement unit 329. The fourth connection unit 331 and the third interconnection reinforcement unit 339 are provided as patterns which are separated from each other. Furthermore, a third adhesive layer 1510 may be provided to cover the top surface 332 of the fourth connection unit 331 within the fourth opening 411, and a fourth adhesive layer 1530 may be provided to cover the top surface of the third interconnection reinforcement unit 339 within the fifth opening 413.

The third package 15 may include a third packaging body layer 2100 having a third semiconductor chip 2200 embedded therein. The third package 15 may include a fifth connection unit 2321 protruding from the third bottom surface 2122 of the third packaging body layer 2100 and may be inserted into the fourth opening 411 so as to be coupled to the third adhesive layer 1510. The third package 15 may include a fourth interconnection reinforcement unit 2329 protruding as a pattern isolated from the fifth connection unit 2321 on the third bottom surface 2122 of the third packaging body layer 2100 and may be inserted into the fifth opening 413 so as to be coupled to the fourth adhesive layer 1530. The third package 15 may be connected to the first package 11.

The third package 15 may be provided in the form of a chip embedding substrate. The third packaging body layer 2100 of the third package 15 may include a stacked structure of a third top dielectric layer 2130 providing a third top surface 2132. The third packaging body layer 2100 of the third package 15 may include a third bottom dielectric layer 2120 providing a third bottom surface 2122. The third packaging body layer 2100 of the third package 15 may include a third middle dielectric layer 2110 stacked between the third top dielectric layer 2130 and the third bottom dielectric layer 2120. Although not illustrated, another dielectric layer, other dielectric layers, or conductive layers forming a circuit pattern for internal wiring may be provided between the respective dielectric layers 2110, 2120, and 2130. The third semiconductor chip 2200 may be seated in a cavity 2111 formed in the third middle dielectric layer 2110.

The fifth connection unit 2321 and the fourth interconnection reinforcement unit 2329, which protrude downward from the third bottom surface 2122 of the third bottom dielectric layer 2120, form a third bottom circuit pattern 2321 and 2329. A fifth through via 2300 is formed through the third packaging body layer 2100 so as to electrically couple a sixth connection unit 2331 of third top circuit patterns 2331, 2335, 2337, and 2339 provided on a third top surface 2132 to the fifth connection unit 2321 of the first bottom circuit patterns 2321 and 2329. The third top circuit patterns may include a fifth coupling unit 2337 and a sixth coupling unit 2335. The fifth coupling unit 2337 is extended from the sixth connection unit 2331 so as to electrically couple the sixth connection unit 2331 and the third semiconductor chip 2200, and the sixth coupling unit 2335 is coupled to a sixth through via 2210 connected to the third semiconductor chip 2200. The sixth through via 2210 which electrically couples the third semiconductor chip 2200 to the second top circuit pattern may have a coupling structure to pass through the third top dielectric layer 2130 covering the third semiconductor chip 2200. For example, the sixth through via 2210 may be provided in the form of a bump.

The fifth through via 2300 may include a stacked structure of a third top through via 2330, a third bottom through via 2320, and a third middle through via 2310. The third top through via 2330 is positioned in a third top through-hole 2133 passing through the third top dielectric layer 2130. The third bottom through via 2320 is positioned in a third bottom through-hole 2123 passing through the third bottom dielectric layer 2120. The third middle through via 2310 fills a third middle through-hole 2113 passing through the third middle dielectric layer 2110. The third bottom through via 2320 may be integrally formed with the fifth connection unit 2321. The third top through via 2330 may be formed to be coupled to a part of the third top circuit patterns 2331, 2335, 2337, and 2339 provided on the third top surface 2132 of the third top dielectric layer 2130. The sixth connection unit 2331 may be coupled to the third top through via 2330 or integrally formed with the third top through via 2330. The second top circuit patterns 2331, 2335, 2337, and 2339 may be provided as a conductive layer pattern formed of copper on the second top surface 2132. The sixth connection unit 2331 and the fifth interconnection reinforcement unit 2339 may be provided to be exposed through sixth and seventh openings 2411 and 2413 of the fourth covering layer 2410, and set to parts which are to be coupled to another package to be stacked over the third package 15. The third package 15 and another package to be stacked over the third package 15 may have the same shape as the first package 11.

Referring to FIGS. 1 and 7, the thickness of the stacked structure of the first, second, and third packages 11, 13, and 15 may be reduced, like the package stacked device 10 having the first and second packages 11 and 13 stacked therein. Thus, although the thickness of the entire package stacked device is limited, a larger number of single packages may be further stacked within the limited thickness.

Figure 8:
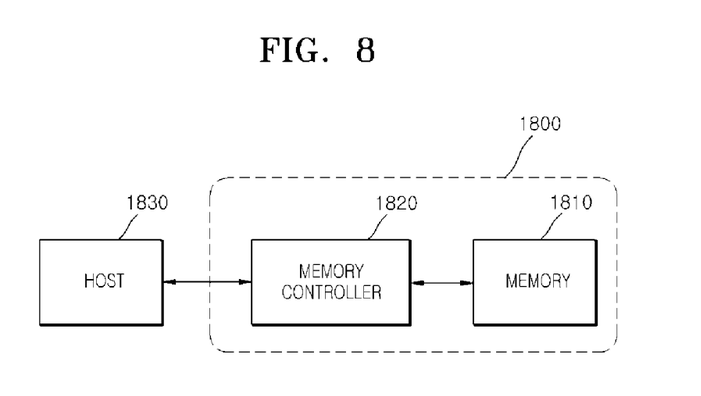
FIG. 8 is a block diagram representation illustrating an electronic system employing a memory card including a package stacked device in accordance with an embodiment.

FIG. 8 is a block diagram illustrating an electronic system including a memory card 1800 including at least one package stacked device according to an embodiment. The memory card may include at least one package stacked device as discussed above with relation to FIGS. 1-7. The memory card 1800 may include a memory 1810, such as, for example, a nonvolatile memory device. The memory card 1800 may also include a memory controller 1820. The memory 1810 and the memory controller 1820 may store data or read stored data. The memory 1810 and/or the memory controller 1820 include one or more semiconductor chips disposed in an embedded package or single package as discussed above according to an embodiment.

The memory 1810 may include a nonvolatile memory device to which the technology of the embodiments as discussed above are applied. The memory controller 1820 may control the memory 1810 such that stored data is read out or data is stored in response to a read/write request from a host 1830.

Figure 9:
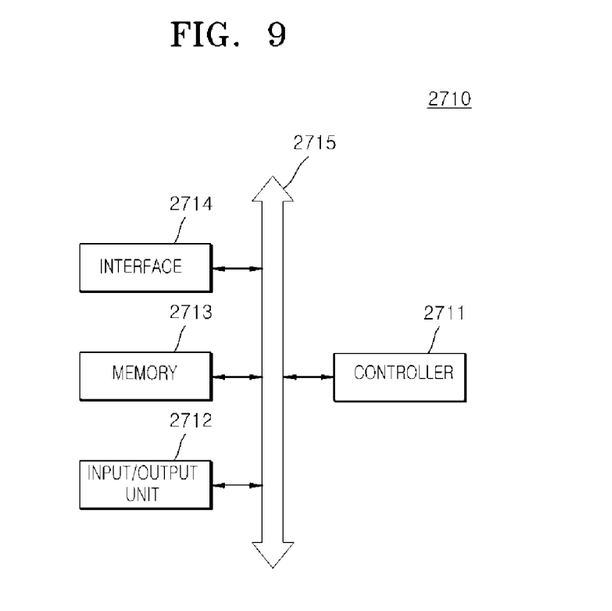
FIG. 9 is a block diagram representation illustrating an electronic system including a package stacked device according to an embodiment.

FIG. 9 is a block diagram illustrating an electronic system 2710 including at least one package stacked device according to an embodiment. The electronic system 2710 may include a controller 2711, an input/output device 2712, and a memory 2713. The controller 2711, the input/output device 2712 and the memory 2713 may be coupled with one another through a bus 2715 providing a path through which data move.

In an embodiment, the controller 2711 may include one or more microprocessor, digital signal processor, microcontroller, and/or logic device capable of performing the same functions as these components. The controller 2711 or the memory 2713 may include one or more of the semiconductor packages or package stacked devices or single packages according to embodiments of the present disclosure. The input/output device 2712 may include at least one selected among a keypad, a keyboard, a display device, a touch screen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A package stacked device comprising:
   a first packaging body layer having a first chip embedded therein;
   a second packaging body layer positioned under the first packaging body layer and having a second chip embedded therein;
   a first connection unit protruding from a first bottom surface of the first packaging body layer;
   a second connection unit protruding from a second top surface of the second packaging body layer;
   a first covering layer providing a first opening to expose the top surface of the second connection unit and covering the second top surface of the second packaging body layer; and
   a first adhesive layer covering the exposed top surface of the second connection unit within the first opening,
   wherein the first connection unit is inserted into the first opening and connected to the first adhesive layer.

2. The package stacked device of claim 1, further comprising:
   a first interconnection reinforcement unit protruding from the first bottom surface of the first packaging body layer and isolated from the first connection unit;
   a second interconnection reinforcement unit isolated from the second connection unit, protruding from the second top surface of the second packaging body layer, and having a top surface of which a part is exposed to a second opening of the covering layer; and
   a second adhesive layer covering the exposed top surface of the second interconnection reinforcement unit within the second opening,
   wherein the first interconnection reinforcement unit is inserted into the second opening and connected to the second adhesive layer.

3. The package stacked device of claim 2, wherein the first connection unit and the first interconnection reinforcement unit are conductive layer patterns forming a part of a first bottom circuit pattern positioned on the first bottom surface of the first packaging body layer.

4. The package stacked device of claim 2, wherein the second connection unit and the second interconnection reinforcement unit are conductive layer patterns forming a part of a second top circuit pattern positioned on the second top surface of the second packaging body layer.

5. The package stacked device of claim 4, further comprising a fourth through via which is formed through a part of the second packaging body layer covering the second chip so as to couple the second chip to another part of the second top circuit pattern coupled to the second connection unit.

6. The package stacked device of claim 1, further comprising:
   a first top circuit pattern positioned on the first top surface of the first packaging body layer; and
   a first through via formed through the first packaging body layer so as to couple a part of the first top circuit pattern to the first connection unit.

7. The package stacked device of claim 6, further comprising a third through via formed through a part of the first packaging body layer, so as to couple the first chip to another part of the first top circuit pattern.

8. The package stacked device of claim 6, further comprising a third covering layer providing a fourth opening to expose another part of the first top circuit pattern as a fourth connection unit, and covering a first top surface of the first packaging body layer.

9. The package stacked device of claim 8, further comprising:
   a third packaging body layer positioned over the first packaging body layer and having a third chip embedded therein;
   a fifth connection unit protruding from a third bottom surface of the third packaging body layer; and
   a third adhesive layer covering the exposed top surface of the fourth connection unit within a fourth opening of the third covering layer, and
   the fifth connection unit is inserted into the fourth opening and connected to the third adhesive layer.

10. The package stacked device of claim 9, wherein the third covering layer provides a fifth opening to expose another part of the first top circuit pattern, separated from the fourth connection unit, as a third interconnection reinforcement unit, and comprises:
    a fourth interconnection reinforcement unit isolated from the fifth connection unit and protruding from the third bottom surface of the third packaging body layer; and
    a fourth adhesive layer covering the exposed top surface of the third interconnection reinforcement unit within the fifth opening of the third covering layer, and
    the fourth interconnection reinforcement unit is inserted into the fifth opening and connected to the fourth adhesive layer.

11. The package stacked device of claim 6, wherein the first packaging body layer comprises a stacked structure of a first top dielectric layer providing the first top surface, a first bottom dielectric layer providing the first bottom surface, and a first middle dielectric layer interposed between the first top dielectric layer and the first bottom dielectric layer, and
    the first through via comprises a stacked structure of a first top through via formed through the first top dielectric layer, a first bottom through via formed through the first bottom dielectric layer, and a first middle through via formed through the first middle dielectric layer.

12. The package stacked device of claim 11, wherein the first chip is seated in a cavity formed in the middle of the first middle dielectric layer.

13. The package stacked device of claim 1, further comprising:
    a second bottom circuit pattern positioned on the second bottom surface of the second packaging body layer; and a second through via coupling a part of the second top circuit pattern to the second connection unit through the second packaging body layer.

14. The package stacked device of claim 13, further comprising a second covering layer providing a third opening to expose a part of the second bottom circuit pattern as a third connection unit and covering a second bottom surface of the second packaging body layer.

15. The package stacked device of claim 1, wherein the top surface of the first covering layer is attached to the first bottom surface of the first packaging body layer.

16. The package stacked device of claim 1, wherein the top surface of the first covering layer is separated from the first bottom surface of the first packaging body layer with a predetermined distance provided therebetween.

17. The package stacked device of claim 1, wherein the first connection unit comprises a conductive layer pattern having a smaller width than the width of the first opening.

18. A package stacked device comprising:
a first packaging body layer;
a second packaging body layer positioned adjacent the first packaging body layer;
a first connection unit protruding from a first bottom surface of the first packaging body layer;
a second connection unit protruding from a second top surface of the second packaging body layer;
a first covering layer providing a first opening to expose the top surface of the second connection unit and substantially covering the second top surface of the second packaging body layer; and
a first adhesive layer substantially covering the exposed top surface of the second connection unit,
wherein the top surface of the first connection unit is within the first opening.

19. The package stacked device of claim 18, wherein the top surface of the first connection unit is coupled to the first adhesive layer.

20. The package stacked device of claim 18, further comprising:
a first chip embedded within the first packaging body layer; and
a second chip embedded within the second packaging body layer,
wherein the first connection unit is electrically coupled with the first chip, and
wherein the second connection unit is electrically coupled with the second chip.

* * * * *